United States Patent [19]
Itoh et al.

[11] Patent Number: 5,293,084
[45] Date of Patent: Mar. 8, 1994

[54] HIGH SPEED LOGIC CIRCUIT

[75] Inventors: Hiroyuki Itoh, Akigawa; Toshiyuki Usagawa, Yono; Atsushi Takai, Kokubunji, all of Japan

[73] Assignee: Hitachi, Ltd., Tokyo, Japan

[21] Appl. No.: 942,181

[22] Filed: Sep. 9, 1992

[30] Foreign Application Priority Data

Sep. 10, 1991 [JP] Japan .................. 3-230043

[51] Int. Cl.$^5$ .................. H03K 19/08; H01L 29/161
[52] U.S. Cl. ................... 307/446; 257/195; 257/197
[58] Field of Search ............ 307/446, 570; 257/195, 257/197-198

[56] References Cited

U.S. PATENT DOCUMENTS

| | | | |
|---|---|---|---|
| 4,779,014 | 10/1988 | Masuoka et al. | 307/446 |
| 4,821,090 | 4/1989 | Yokoyama | 257/195 |
| 5,012,318 | 4/1991 | Honjo | 257/195 |
| 5,151,618 | 9/1992 | Yokoyama | 257/197 |
| 5,206,546 | 4/1993 | Usami | 307/446 |

FOREIGN PATENT DOCUMENTS 62-199049  2/1987  Japan .
63-236358  3/1988  Japan .

OTHER PUBLICATIONS

IEEE Journal of Solid State Circuits, vol. SC-14, #3, Jun. 1979, pp. 585-590.
IEEE Transactions on Electron Devices, vol. 38, #2, Feb. 1991, pp. 222-231.
IEEE Journal of Solid-State Circuits, vol. SC-7, Oct. 1972, pp. 340-346.
IEEE Journal of Solid-State Circuits, vol. SC-7, Oct. 1972, pp. 346-351.

*Primary Examiner*—Edward P. Westin
*Assistant Examiner*—Andrew Sanders
*Attorney, Agent, or Firm*—Antonelli, Terry, Stout & Kraus

[57] ABSTRACT

In a high speed logic circuit using a vertical hetero-junction bipolar transistor, in which two-dimensional carriers formed at a semiconductor hetero-junction interface are used as a base layer, the uppermost layer being a collector layer, the lowest layer being an emitter layer, two base electrodes making contact with the base layer are disposed so as to put a collector electrode, which is electrically in contact with the collector layer, therebetween. The base electrodes are used at the same time as a source electrode and a drain electrode, respectively, of a field effect transistor using the two-dimensional carriers as an active layer. The high speed logic circuit is so constructed that one of the base electrodes of the bipolar transistor is an input terminal; the other is connected with a power supply; the emitter is grounded; and the collector is an output terminal.

19 Claims, 11 Drawing Sheets

HIGH SPEED LOGIC CIRCUIT

BACKGROUND OF THE INVENTION

The present invention relates to a logic circuit, and in particular to a high speed logic circuit using semiconductor devices, each having a device structure making the best use of characteristics of a hetero-junction bipolar transistor.

Owing to recent progress in the MBE (Molecular Beam Epitaxy) and the MOCVD (Metal Organic Chemical Vapor Deposition) technology, crystal growth can be effected with controllability at atomic level.

A hetero-junction bipolar transistor (HBT) having a new structure making use of two-dimensional charge carriers at a semiconductor hetero-junction interface formed by the technologies described above is disclosed in JP-A-Sho 62-199079, in which it is shown that a bipolar transistor (BJT) using two-dimensional charge carriers (or an inversion layer, a storage layer) at a semiconductor hetero-junction interface as a base layer and an electric field transistor (FET) using a bipolar transistor (BJT) as an active layer can be formed in a same substrate, making it possible to realize a circuit, where there exist BJTs and FETs mixedly.

As a technology, by which BJTs and FETs are used mixedly, e.g. the BiCMOS technology is well known, by which an Si BJT and a CMOS (complementary type metal-oxide-semiconductor) FET are formed simultaneously. Consequently, even with a BJT using a hetero-junction and an FET, from the point of view of circuit construction, it is relatively easy to realize a circuit similar to the BiCMOS. However such a circuit is formed merely by diverting almost a basis prior art circuit and it cannot be said that it makes the best use of the crystal growth technology having the controllability at atomic level and the device structure using it.

Figure 14A:
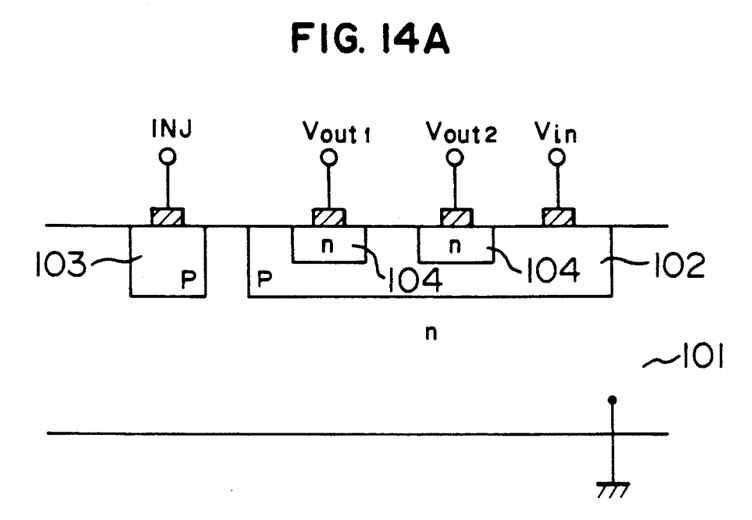
FIG. 14A is a cross-sectional view indicating schematically the construction of a prior art IIL circuit.

On the other hand there is known the IIL (Integrated Injection Logic) circuit as an SiBJT, for which high density integration is possible and which can be fabricated by a simple fabrication process. In the IIL circuit, a one-gate circuit can be realized with almost one transistor while reducing the area of the circuit owing to a construction, in which an npn type transistor of inversely-biased operation and a horizontal pnp type transistor are combined. FIG. 14A is a cross-sectional view showing a basic construction of a prior art IIL circuit and FIG. 14B is an equivalent circuit diagram thereof.

Figure 14B:
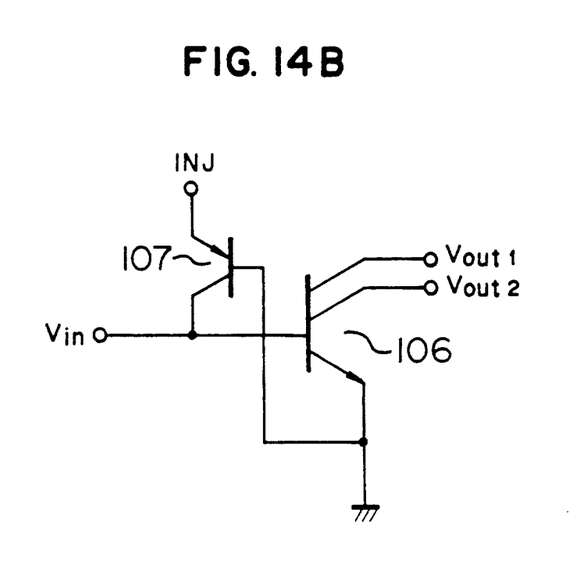
FIG. 14B is an equivalent circuit diagram thereof.

The IIL circuit is constructed, as indicated in FIG. 14A, by forming p-type regions 102 and 103 in an n-type substrate 101 by using the diffusion or ion implantation technology and further by forming an n-type region 104 and this circuit can be represented by the equivalent circuit as indicated in FIG. 14B. An npn type transistor 106 effecting a logic operation is realized by a vertical transistor of inversely-biased operation, the n-type region 101, the p-type region 102 and the n-type region 104 serving as an emitter, a base and a collector, respectively. The emitter of the vertical transistor, i.e. substrate, is grounded. On the other hand, a pnp type transistor 107 acting as an injector has the p-type region 102 as the collector in common with the base region of the transistor 106 and the n-type substrate 101 as the base in common with the emitter region of the transistor 106. The p-type region 103 serves as the emitter thereof.

The operation of this circuit is realized by two states, in which the pnp type transistor 107 supplies injector current to the base of the transistor 106 or to the preceding gate circuit. That is, when the preceding gate circuit is in a state where no current flows therethrough (hereinbelow called OFF state), since the injector current flows to the base of the transistor 106, a state is established where current flows through the transistor 106 (hereinbelow called ON state). Therefore output terminals Vout 1 and Vout 2 pull-in current from the succeeding gate circuit so that potentials thereof are close to the ground potential. On the contrary, when the transistor in the preceding gate circuit is in the ON state, since the injector current is drawn by the collector in the preceding gate circuit, the transistor 106 is in the OFF state so that the potentials of the output terminals Vout 1 and Vout 2 are at a logic high level, i.e. higher than the ground potential by the base-emitter voltage of the transistor in the succeeding stage.

The IIL circuit is fabricated by the diffusion or ion implantation technology. N or p-type layers are formed while effecting impurities compensation so that the higher the layer is, in other words the later the fabrication step is, the higher the concentration of impurities is, with which the layer is doped. As the result, in the pn junction formed by the emitter (presumed to be n-type), which is the uppermost layer, and the base (presumed to be p-type), which is directly below it, electrons injected from the emitter to the base are much more abundant than holes injected from the base to the emitter. For this reason, base current is small and current gain is great. Similarly, in the base-collector junction, holes injected from the base to the collector are much more abundant than electrons injected from the collector to the base. This means that the current gain is small at the inversely-biased operation, in which the collector acts as the emitter. This means further that the amount of holes stored in the collector increases in the saturation region, i.e. in the operation region where the base-collector junction is forward-biased, in the usual forward-biased operation. Consequently, the IIL circuit using a transistor of inversely-biased operation with the collector on the upside has a drawback that, since the cut-off frequency cannot be raised and in addition the current gain is low, a great amount of minority carriers (holes) are stored in the substrate acting as the emitter and the working speed is low.

Figure 15A:
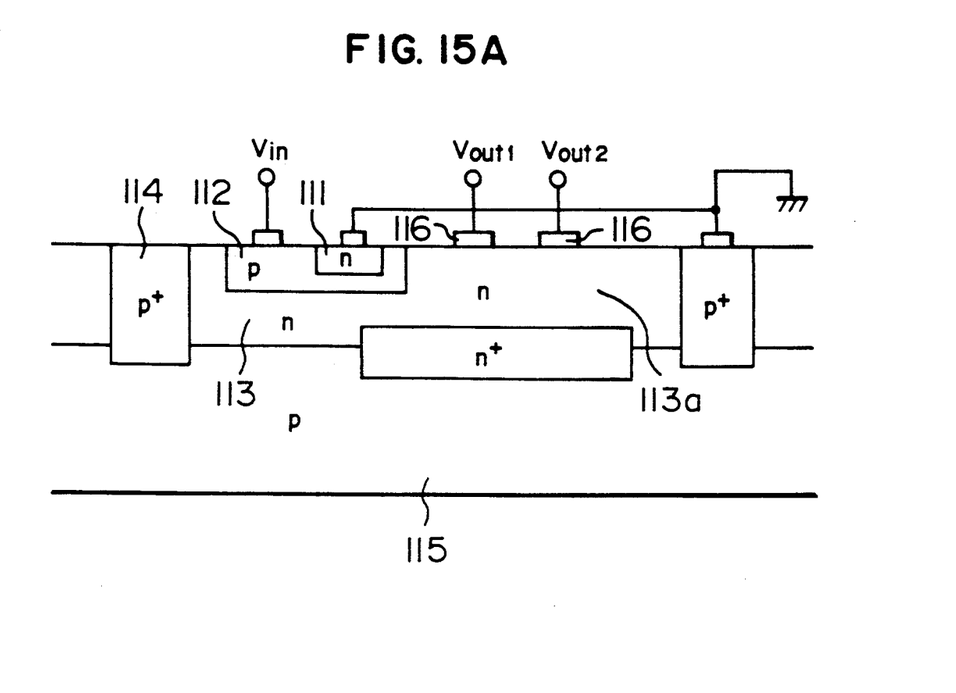
FIG. 15A is a cross-sectional view indicating schematically the construction of a prior art ISL circuit.
Figure 15B:
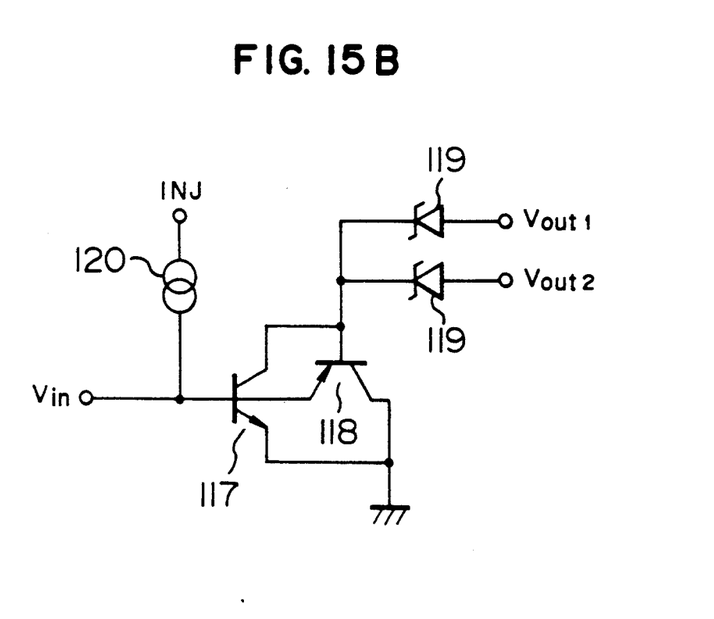
FIG. 15B is an equivalent circuit diagram thereof.

Therefore various sorts of IIL type circuits improved at this point have been proposed. A circuit disclosed e.g. in IEEE JOURNAL OF SOLID-STATE CIRCUITS, VOL. SC-14 No. 3, JUNE 1979, pp. 585–590, called ISL (Integrated Schottky Logic), is indicated in FIGS. 15A and 15B. FIG. 15A shows the device structure of the ISL circuit and FIG. 15B shows the equivalent circuit thereof.

As indicated in FIG. 15A, the npn type transistor 117 effecting logic operation in the ISL circuit has a vertical structure, in which the emitter, the base and the collector are realized by the n-type region 111, the p-type region 112 and the n-type region 113, respectively. In FIG. 15B, Schottky diodes 119 connected with the output terminals Vout 1 and Vout 2 are realized by forming Schottky electrodes 116 on an n-type region 113a. The pnp type transistor 118 has a structure combined with the transistor 117, in which the p-type region 112, the n-type region 113 and the p-type region 114 or 115 serve as the emitter, the base and the collector, respectively. An injector 120 is formed separately by resistors, etc., differently from the IIL circuit, although it is not indicated in FIG. 15A. What is intended to be improved by this circuit with respect to the IIL circuit is following two points; that (1) the inversely-biased operation of the transistor is abandoned and the transistor is used in the forward-biased operation and that (2) lowering in the working speed due to the fact that the working point enters the saturation region when the transistor is turned-on so that minority carriers are stored therein is avoided. In order to realize the first point, it is necessary to separate the output terminals from each other. For this purpose the Schottky diodes 119 described above are formed. In order to realize the second point, there is a method, by which clamping means is added so that the collector potential of the transistor 117 is not lowered excessively. In FIG. 15B the pnp type transistor 118 constitutes this clamping means, which makes holes, which are minority carriers stored in the collector, flow from the region 113 to 114 or 115 owing to the operation of the transistor 118, when the transistor 117 is in the ON state, so as to prevent the storage of the minority carriers.

The logic circuit such as the ISL circuit described above, etc., improved type of the IIL circuit, is better than the IIL in the circuit speed, etc., because a vertical transistor of forward-biased operation is used, but it is realized at the cost of some characteristics, which the original IIL circuit has. For example, in the ISL circuit, an element isolation region is required similarly to the case where a usual BJT is used, while no element isolation region is required in the ISL circuit, etc., because the emitter of the transistor of inversely-biased operation is the n-type substrate, which can be used at the same time for other transistors, and therefore it is difficult to increase the degree of integration. In addition, Schottky diodes are required for isolating a plurality of outputs and further clamping means is necessary for preventing the storage of minority carriers due to the saturation of the transistors, which makes the construction complicated. Furthermore, even if the clamping means is disposed, it is impossible to prevent completely the storage of minority carriers. Therefore there were problems that increase in the speed was limited, etc.

SUMMARY OF THE INVENTION

The object of the invention is to provide an IIL type logic circuit, solving the problematical points of the IIL type circuit described above, by which a high speed operation is possible and it is easy to increase the degree of integration.

The logic circuit according to the present invention is a high speed logic circuit using a vertical bipolar transistor, which is so constructed that the uppermost layer acts as the collector layer and the lowest acts as the emitter layer; two base electrodes are disposed horizontally, putting the collector electrode on the collector layer therebetween to make contacts with the base layer, these two base electrodes serving at the same time as a source and a drain electrode, respectively, of a field effect transistor using the base layer of the bipolar transistor as an active layer; and one of the base electrodes of the bipolar transistor stated above is connected with an input terminal and the other is connected with a power supply, the emitter being grounded, the collector serving as an output terminal. Preferably, in this bipolar transistor, the junction portion between the base and the emitter is constructed by a hetero-junction and a hetero-junction bipolar transistor (HBT) is used, in which two-dimensional charge carriers formed at this hetero-junction interface act as a real base layer. Further this HBT is formed by effecting suitable epitaxial growth so that characteristics of the inversely-biased operation with the collector on the upside are improved, in order to be applied to the IIL circuit. It is more desirable that, in this HBT, another hetero-junction is introduced also between the base and the collector.

Owing to use of a BJT of inversely-biased operation, in which the uppermost layer of a vertical BJT serves as the collector and the lowest layer acts as the emitter, similarly to the IIL, it is possible to use the substrate in common at the ground potential on one chip and to make isolation in the emitter region at the lowest layer (in the inversely-biased operation) unnecessary. Further, owing to use of a HBT, in which a hetero-junction is introduced for the base-emitter junction, for this BJT, it is possible to realize characteristics equivalent to those of a vertical BJT of forward-biased operation, in which the uppermost layer acts as the emitter. Still further, owing to introduction of a hetero-junction also between the base and the collector, it is possible to prevent storage of minority carriers in the collector at the saturation operation of the BJT and thus to realize an operation of a higher speed logic circuit. Furthermore, in order to facilitate high density integration, it is necessary to decrease the number of elements constituting a gate circuit as much as possible. According to the present invention, the pnp type transistor acting as an injector in the IIL circuit is eliminated and the operation as BJT and the operation as FET are realized simultaneously by one HBT using the working mode of HBT as FET instead thereof for the injector. Consequently one gate circuit can be constructed by just one HBT and in this way increase in the degree of integration is made extremely easy.

DESCRIPTION OF THE PREFERRED EMBODIMENTS

Figure 1A:
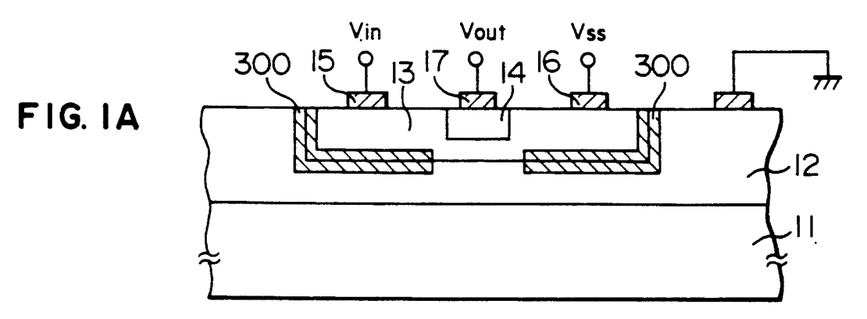
FIG. 1A is a cross-sectional view indicating schematically the device structure of a high speed logic circuit according to an embodiment of the present invention.
Figure 1B:
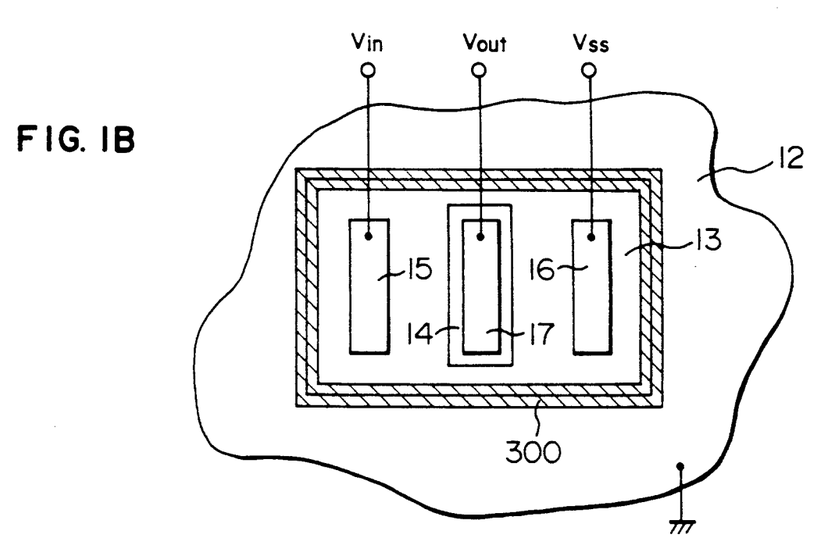
FIG. 1B is a plan view thereof.
Figure 1C:
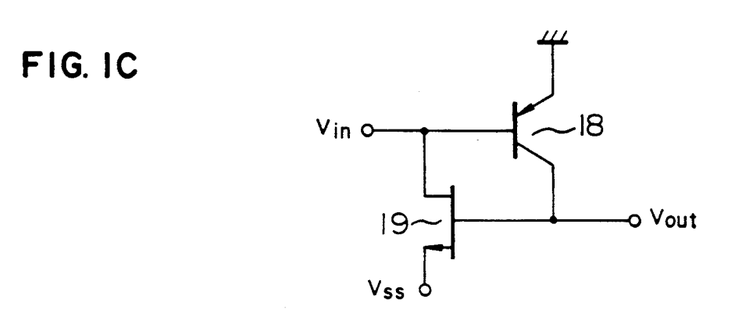
FIG. 1C is an equivalent circuit diagram thereof.

FIGS. 1A, 1B and 1C show an embodiment of the high speed logic circuit according to the present invention; FIG. 1A being a cross-sectional view indicating schematically the device structure thereof; FIG. 1B being a plan view thereof; FIG. 1C being an equivalent circuit diagram thereof.

In FIGS. 1A and 1B, reference numeral 11 is a semi-insulating GaAs substrate, on which a p-type region 12, an n-type region 13 and a p-type region 14 are formed. On the n-type region 13 electrodes 15 and 16 connected with an input Vin and a power supply Vss, respectively, are formed so as to put the p-type region 14 therebetween. On the p-type region 14 an electrode 17 connected with an output Vout is formed. Further the p-type region 12 is grounded. Here a region 300 formed at the interface portion between the n-type region 13 and the P-type region 12 except for the lower portion of the p-type region 14 is an isolation region. As described later more in detail, the isolation region is disposed for insulating a part of the junction interface between the p-type region 12 and the n-type region 13 to reduce leak current.

In the present embodiment the pnp type BJT constituted by the p-type region 12, the n-type region 13 and the p-type region 14 is driven in the direction opposite to usual one. That is, the p-type region 14, which is the uppermost layer, is operated as the collector, the n-type region 13 is used as the base, and the p-type region 12 is used as the emitter. Consequently this BJT is used by grounding the emitter and using the base and the collector as the input and the output, respectively, from the point of view of a circuit. Further, as described previously, this circuit has at the same time a function of an FET, whose channel is the n-type region 13, i.e. the base region, by disposing the electrode connected with Vin and the electrode connected with Vss so as to put the electrode connected with Vout therebetween. When an element having such a structure is expressed by an equivalent circuit, it can be represented, as described in FIG. 1C.

In the present embodiment, a hetero-junction is used for the pn junction between the p-type region 12 and the n-type region 13 and an HBT using a two-dimensional electron gas layer formed on the n-type region 13 side with respect to this pn junction portion as the base of the BJT (2DEG-HBT) is used.

The HJT can be fabricated by the crystal growth technology having controllability at atomic level such as MBE and MOCVD. Therefore it is possible to form a crystal having a desired composition at a desired impurity level for each of the layers, independently from the impurity level of the underlayer. As the result, differently from prior art transistors, the impurity level can be optimized for each of the layers so that characteristics are improved in the inversely-biased operation. Further a pn junction between semiconductors having different energy gaps such as GaAs and AlGaAs, i.e. a hetero-junction, can be utilized therefor. While, in a usual pn junction, i.e. a homogeneous junction, injected amounts of electrons and holes (or difference therebetween) can be controlled almost only through impurity levels, in a hetero-junction it is possible to control the injected amounts also by utilizing discontinuity of the energy band. Therefore by utilizing a hetero-junction it is possible to design a transistor so as to reduce the saturation thereof, independently from design of the concentration for designing current from the emitter to the collector, collector withstand voltage, etc.

Further device characteristics of HBT using two-dimensional electron gas as two-dimensional charge carriers (called 2DEG-HBT, meaning a two-dimensional electron gas base HBT) have been analyzed more in detail and following facts have been found (discussed in detail in IEEE Transactions on Electron Devices, Vol. 38, No. 2, 1991, pp. 222–231). For example, in a hetero-junction of GaAs/AlGaAs system, when the content of Al is 0.3 as usually used, the conduction band discontinuity $\Delta Ec$ is 300 meV and the valence electron discontinuity $\Delta Ev$ is 50 meV, $\Delta Ec$ being about 6 times as great as $\Delta Ev$. For this reason, as discussed in detail in Section B. Frequency Performance Analysis on p. 225 of the same article, the delay time by the emitter $\tau E$ is as small as 0.02–0.1 pico seconds, this value being negligibly small. This is a feature of GaAs/AlGaAs pnp HBT, contrarily to the fact that an analogous GaAs/AlGaAs npn HBT has a delay time by the emitter $\tau E$, which is 1.0 pico second, due to the fact that $\Delta Ev$ is small.

Getting a hint therefrom, the inventors of the present invention have studied by simulation an aspect of minority carriers (electrons in this case) stored in the collector layer, when the junction between the base and the collector is forward-biased in a double hetero-junction 2DEG-HBT, in which the base-collector junction is a hetero-junction, the band gap of the collector being greater, and found that minority carriers can be reduced remarkably. An element was fabricated in trial and this effect was verified also experimentally.

As described above, when the 2DEG-HBT is used for the transistor, it is possible not only to realize a high performance BJT but also to obtain a high performance, even if the BJT is used in the inversely-biased operation. Further, since the 2DEG-HBT has the working mode as a high speed FET, by using the device structure indicated in FIG. 1A it is possible to realize equivalently the circuit indicated in FIG. 1C and thus the operation as a gate circuit as described below is made possible.

Hereinbelow the operation as a gate circuit as indicated in FIGS. 1A to 1C will be explained, referring to FIGS. 2A, 2B, 3A and 3B.

Figure 2A:
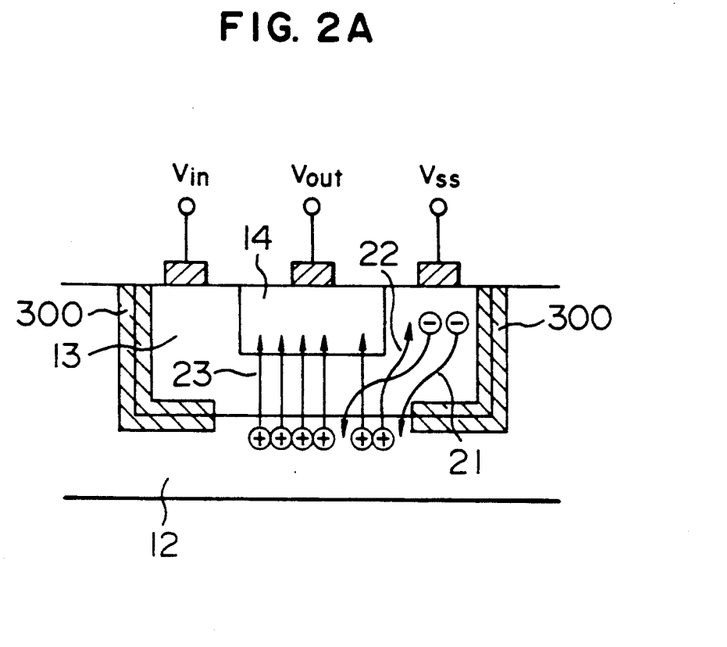
FIG. 2A is a cross-sectional view showing the logic operation of a BJT, when it is in an ON state.

At first, in the state where no current flows from the input terminal Vin in FIG. 1A, i.e. when Vin is logically at a low level (hereinbelow this is called Low level and the opposite level is referred to High level), the output terminal of the gate circuit at the preceding stage is in a high impedance state, as described later and the Vss terminal is in the open state. Consequently the BJT 18 is cut-off from the preceding stage and operated as a usual BJT, in which only the Vss terminal acts as the base electrode. FIG. 2A represents this state schematically.

Figure 2B:
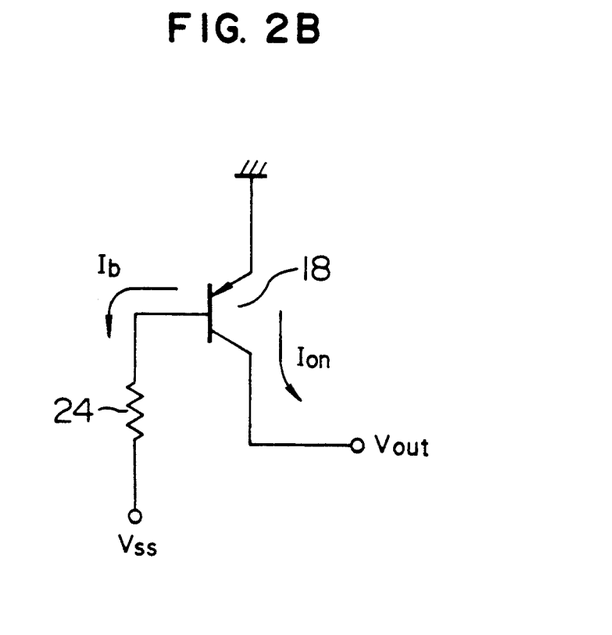
FIG. 2B is an equivalent circuit diagram thereof.

Since the n-type region 13 connected with Vss serving as the negative electrode and the p-type region 12 at the ground potential are forward-biased, as indicated in FIG. 2A, electrons in the n-type region 13 and holes in the p-type region 12 are injected into the respective opposite regions as minority carriers as indicated by arrows 21, 22 and 23. Since the thickness of the n-type region 13 is small, the major part of the holes injected into it arrives at the p-type region 14, as indicated by the arrow 23 and thus it is operated as a usual BJT. If this is expressed by an equivalent circuit, a diagram indicated in FIG. 2B is obtained. Here a resistor 24 represents exaggeratedly that only one base electrode is used in FIG. 2A and in practice in many cases it can be almost neglected. Flows of the electrons and the holes indicated by the arrows 21 and 22, respectively, in FIG. 2A constitute the base current Ib in FIG. 2B. Similarly the electrons arriving at the p-type region 14 constitutes the collector current Ion in FIG. 2B. Ion represents in turn the output current flows into the gate circuit in the succeeding stage, which is constructed similarly, and the intensity thereof is determined by the current pulled-in by the gate circuit in the succeeding stage.

Figure 3A:
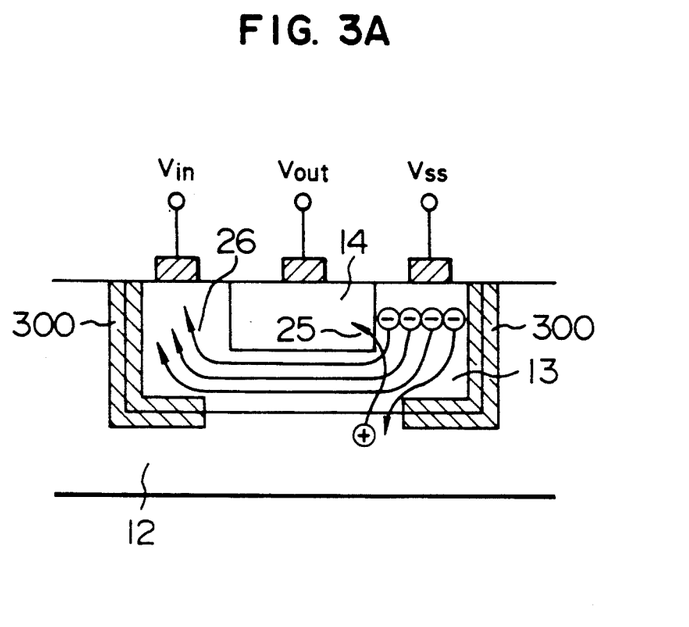
FIG. 3A is a cross-sectional view showing the logic operation of the BJT, when it is in an OFF state.
Figure 3B:
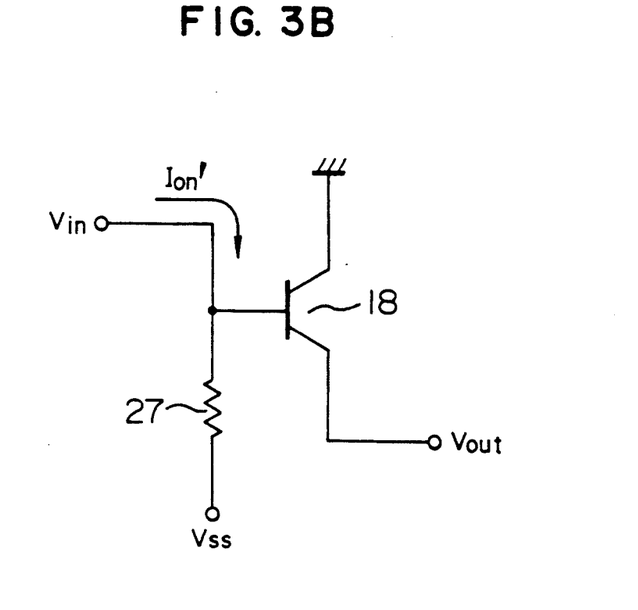
FIG. 3B is an equivalent circuit diagram thereof.

On the other hand, when the circuit is in a state where current Ion' corresponding to the current Ion described above flows from the gate circuit in the preceding stage into the terminal Vin, the base region (n-type region 13) of the BJT 18 acts as the n-type channel of the FET as the working mode of the BJT 18 as FET and flow of electrons is produced from the electrode Vss to the electrode Vin, as indicated by the arrow 26 in FIG. 3A. However it is supposed that the potential difference between Vout and Vss corresponding to the gate voltage of the PET is greater than the threshold voltage Vth of this FET and therefore the FET is in the ON state. At this time, the pn junction between the p-type region 12 and the n-type region 13 (channel of the FET) is forward-biased more strongly on the side nearer to Vss due to the voltage drop along the channel and on the contrary it is almost not biased on the side nearer to Vin. Consequently, in the BJT 18, only a small amount of holes flows on the side nearer to Vss, as indicated by the arrow 25, and thus almost no collector current Ion flows so that the output Vout is in a high impedance state. When the operation described above is expressed by an equivalent circuit, it can be represented as indicated in FIG. 3B, in which the resistor 27 represents the resistance of the n-type region 13 serving as the channel region of the FET. The current Ion' from the preceding stage flows to the power supply Vss through the resistor 27. In this case, since the current Ion' is relatively great, differently from the case indicated in FIG. 2B, the voltage drop across the resistor 27 is great and the base potential of the BJT 18 is raised significantly from the negative power supply Vss. Therefore the BJT 18 is almost in the OFF state. The isolation region 300 is disposed for reducing leak current at the pn junction between the p-type region 12 and the n-type region 13 forward-biased at this time. In the case where there is no isolation region 300, there exists a part where the potential difference of Vss is applied directly to the pn junction between the p-type region 12 and the n-type region 13, the junction current at this part being leak current. Presence or absence of the isolation region 300 has nothing to do with the basic operation of the present embodiment.

Taking the equivalent circuits indicated in FIGS. 2B and 3B and the characteristics of the 2DEG-HBT explained above into account, the operation of the equivalent circuit indicated in FIG. 1C can be explained as follows. In the ON state of the BJT 18, since the terminal Vout, i.e. the gate terminal of the FET in FIG. 1C is at the high level, the FET 19 is in the ON state and the ON resistance 24 (FIG. 2B) is extremely small. On the other hand, in the OFF state of the BJT, since the gate terminal of the FET 19 is at the low level, the FET 19 is in the OFF state and the ON resistance 27 (FIG. 3B) is great. Consequently the BJT 18 is turned OFF by the voltage drop due to the current Ion from the preceding stage. As explained above, the operation of the logic circuit in the present embodiment is well expressed by using the equivalent circuit indicated in FIG. 1C.

Figure 4:
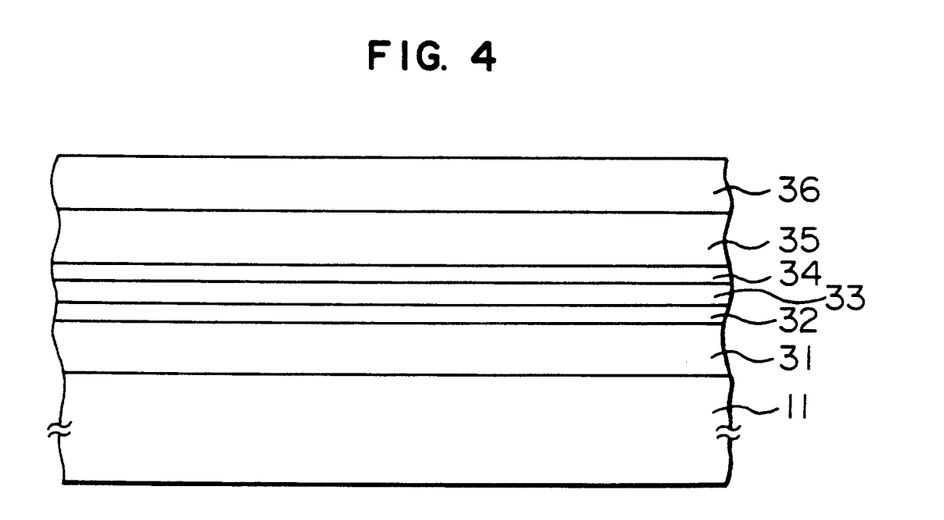
FIG. 4 is a cross-sectional view indicating a state of semiconductor layers superposed on each other.

Now the above embodiment will be more concretely explained by using FIG. 4 and followings.

FIG. 4 shows an example of the cross-sectional structure of semiconductor layers, in which the logic circuit according to the present invention is formed.

Figure 5A:
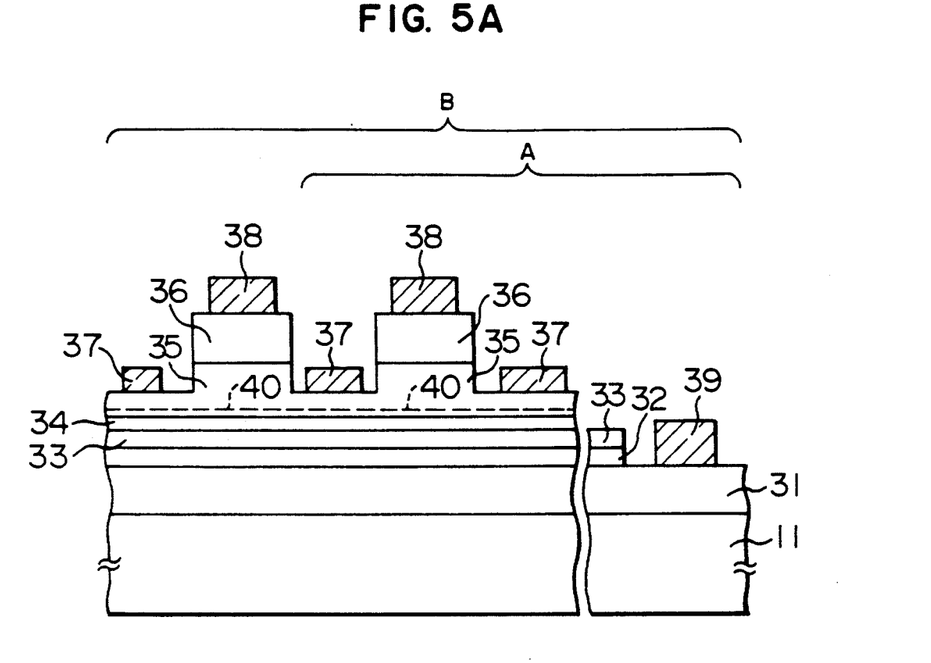
FIG. 5A is a cross-sectional view indicating an example of the device structure of the logic circuit according to the present invention.

As indicated in FIG. 4, the semiconductor layers, in which the logic circuit according to the present invention is formed, is constructed by superposing a p-type GaAs layer 31, a p-type AlGaAs layer 32 (here the composition ratio x (x for Al and 1−x for Ga) being about 0.45), an n-type AlGaAs layer 33 (here the composition ratio y (y for Al and 1−y for Ga) being about 0.3), undoped (high purity) GaAs layer 35, and a p-type GaAs layer 36 one after another on a semi-insulating GaAs substrate 11 by epitaxial growth by MBE or MOCVD, etc. The thicknesses of these layers are about 500 nm, 200 nm, 26 nm, 4 nm, 300 nm, and 400 nm, respectively. Thereafter, in order to form various electrodes, the upper layers are selectively etched by reactive ion etching (RIE) up to the undoped GaAs layer 35 or the p-type GaAs layer 31 so as to expose partially the undoped GaAs layer 35 and the p-type GaAs layer 31. Then various electrodes 37 to 39 are formed by using the usual lithography technology and the electrode formation technology, as indicated in FIG. 5A. In the present embodiment a depletion type FET is used for the FET.

Figure 5B:
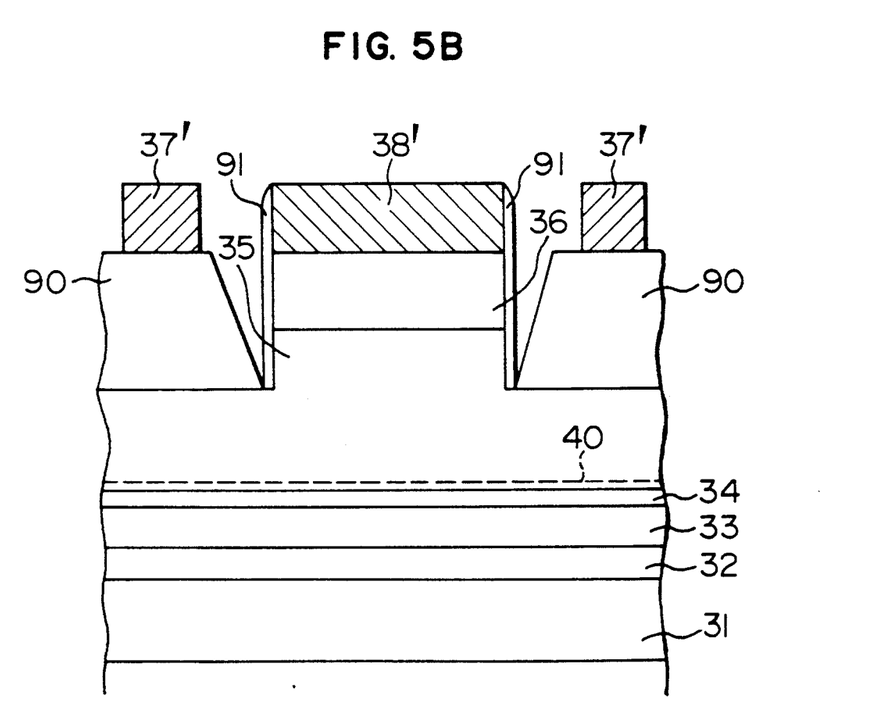
FIG. 5B is a cross-sectional view showing another example of the construction of the base electrode of the logic circuit indicated in FIG. 5A.

The source-drain (base) electrode region is formed directly on the undoped GaAs layer 35, as indicated in FIG. 5A. Apart therefrom it may be formed also as indicated in FIG. 5B. That is, a collector region is formed on the p-type GaAs layer 36 serving as the collector layer 36 by using highly heat resisting metal 38' such as WSi and the part where the source-drain (base) electrode region is removed by etching up to a middle point of the undoped GaAs layer 35. Then a side wall insulating film 91 is formed on the side surface of the exposed collector region by CVD $SiO_2$. Thereafter a high impurity concentration n-type GaAs layer 90 is selectively grown at a thickness of about 300 nm by MOCVD and the source-drain (base) electrodes 37' are formed. It is useful for decreasing the base resistance of the BJT or the resistance between the source and the gate in the operation mode as FET to form the source-drain (base) electrodes 37' as described above. Further, in this way it is possible to decrease the parasitic resistance and thus to contribute to improvement of characteristics of the device. Further such a method for forming the source - drain (base) electrodes 37' is useful also for the double hetero-junction 2DEG-HBT, which will be explained later.

In FIG. 5A, the region indicated by A in the figure is the part representing the concrete cross-sectional structure of the logic circuit indicated in FIGS. 1A, 1B and 1C. In FIG. 1A, the p-type region 14 serving as the collector region is realized by the undoped GaAs layer 35 and the p-type GaAs 36, on which the electrode 38 is formed, in FIGS. 5A and 5B. The n-type region 13 in FIG. 1A corresponds to the n-type AlGaAs 33 and the undoped AlGaAs 34. However what acts as the base layer of the BJT or the active layer (channel) of the FET in reality is the two-dimensional electron gas layer 40 formed at the hetero-junction interface. This two-dimensional electron gas layer is formed on the undoped GaAs layer 35 side of the hetero-junction interface between the undoped AlGaAs layer 34 and the undoped GaAs layer 35 and the film thickness thereof is about 10 nm. The source-drain (base) electrodes 37 are disposed so as to form ohmic contacts with respect to the two-dimensional electron gas and act as the electrodes for Vin and Vss indicated in FIG. 1A. The p-type region 12 serving as the emitter region in FIG. 1A is realized by the p-type AlGaAs layer 32. The emitter electrode 39 forms an ohmic contact to the p-type AlGaAs layer 32 through the p-type GaAs layer 31. Further this emitter electrode 39 is grounded from the point of view of the potential.

Figure 6:
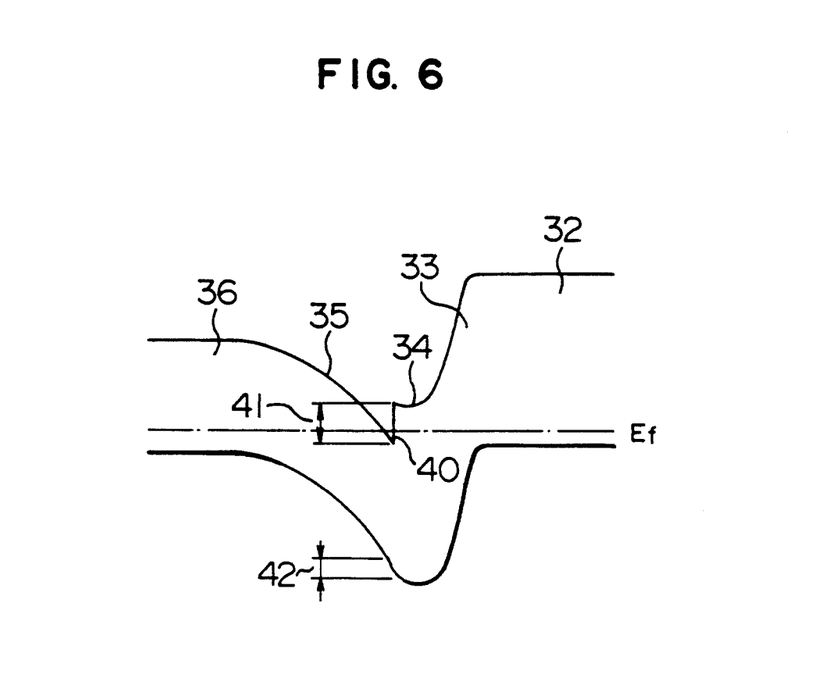
FIG. 6 is a diagram indicating an energy band corresponding to the device structure indicated in FIGS. 5A and 5B.

FIG. 6 is a diagram representing the energy band corresponding to the device structure indicated in FIGS. 5A and 5B. In the figure, Ef represents the Fermi level in the zero bias state. In the hetero-junction having the two-dimensional electron gas layer 40 a discontinuity $\Delta E_c$ (about 300 mV) 41 in the conduction band due to a difference in the electron affinity between GaAs and AlGaAs and a discontinuity $\Delta E_v$ 42 in the valence electron band are formed. By using such a hetero-junction system it is possible to realize a base layer having a very small base resistance and a small film thickness owing to two-dimensional electron gas, as indicated in JP-A-Sho 62-199049. At the same time it is possible to locate the two-dimensional electron gas so as to be parallel to the hetero-junction interface and to drive it as an FET, in which flow thereof is controlled by the gate electrode.

Figure 7:
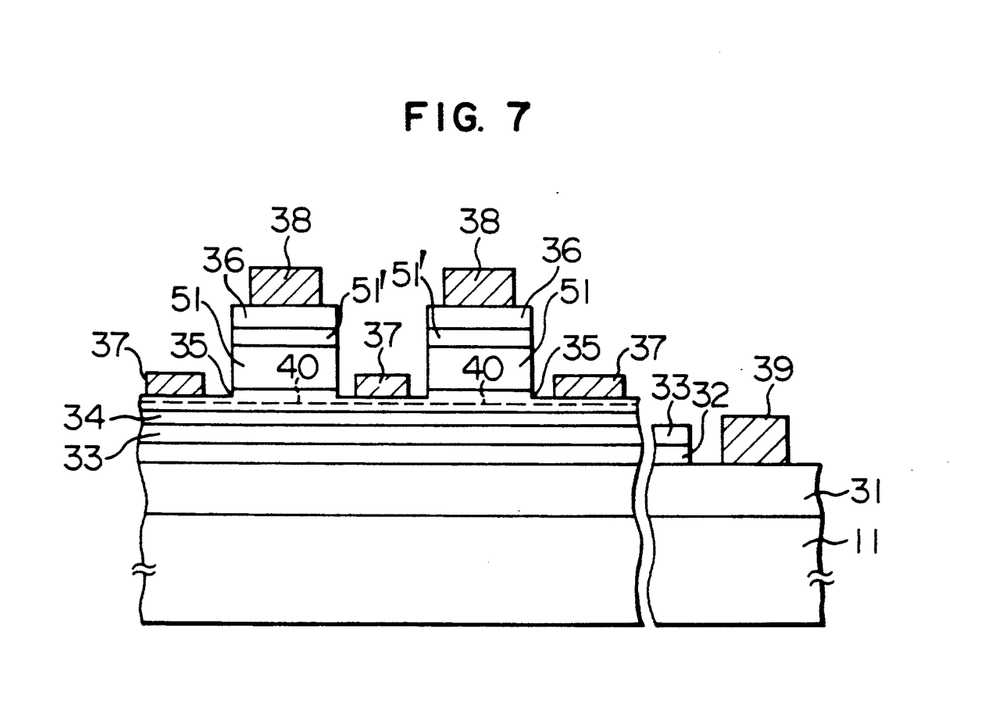
FIG. 7 is a cross-sectional view indicating another example of the device structure of the logic circuit according to the present invention.

From the energy band diagram indicated in FIG. 6 it can be understood that the potential barrier is made higher for electrons, which are minority carriers for the base, by the discontinuity $\Delta E_c$ 41 in the valence electron band, which suppresses injection into the emitter region 32, so that the base current is decreased and the current gain is increased. However, in the device structures indicated in FIGS. 5A and 5B, the hetero-junction is applied only to the junction portion between the emitter and the base and no hetero-junction is used for the junction between the base and the collector. For this reason, injection of electrons into the collector and storage of electrons in the collector are not necessarily suppressed. Therefore it is conceivable to adopt the hetero-junction also for the junction between the base and the collector and to decrease the injection of electrons into the collector and the storage of electrons in the collector. FIG. 7 shows an example of the device structure, in which this idea is adopted.

In FIG. 7, an undoped AlGaAs layer 51 and a p-type AlGaAs layer 51' are added between the undoped GaAs layer 35 and the p-type GaAs layer 36, compared with FIG. 5A. In the present embodiment, the BJT constituting the logic circuit is constructed by a double hetero-junction 2DEG-HBT by forming a hetero-junction for the junction portion of the undoped GaAs layer 35 and the undoped AlGaAs layer 51 between the base and the collector in addition to the hetero-junction of the undoped AlGaAs layer 34 and the undoped GaAs layer 35. The undoped GaAs layer 35 is 150 nm thick; the undoped AlGaAs layer 51 is 150 nm thick; and the p-type AlGaAs layer 51' is 200 nm thick. Design of these layers can be varied, depending on the purpose of application. By adopting such a structure it is possible to decrease minority carriers stored in the collector in the ON state of the BJT, i.e. in the saturation region and thus transition from the ON state to the OFF state can be effected extremely rapidly. Further it is possible to separate the problem of the saturation from design of the film thickness and the impurity concentration for the purpose of increasing the withstand voltage, etc.

Figure 8:
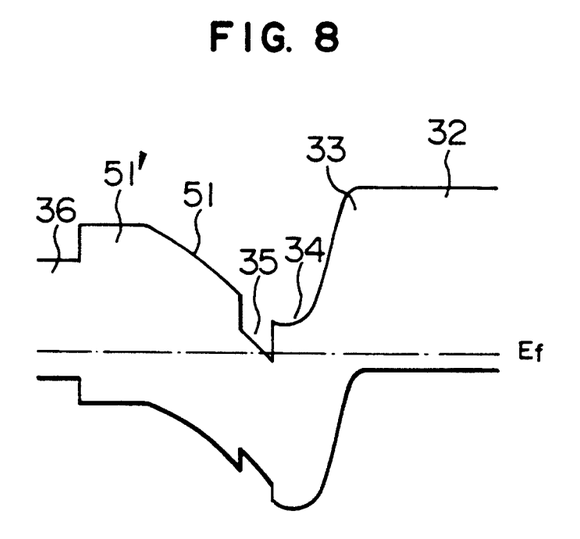
FIG. 8 is a diagram indicating an energy band corresponding to the device structure indicated in FIG. 7.

FIG. 8 shows an energy band diagram in the device structure of the embodiment indicated in FIG. 7.

Figure 9:
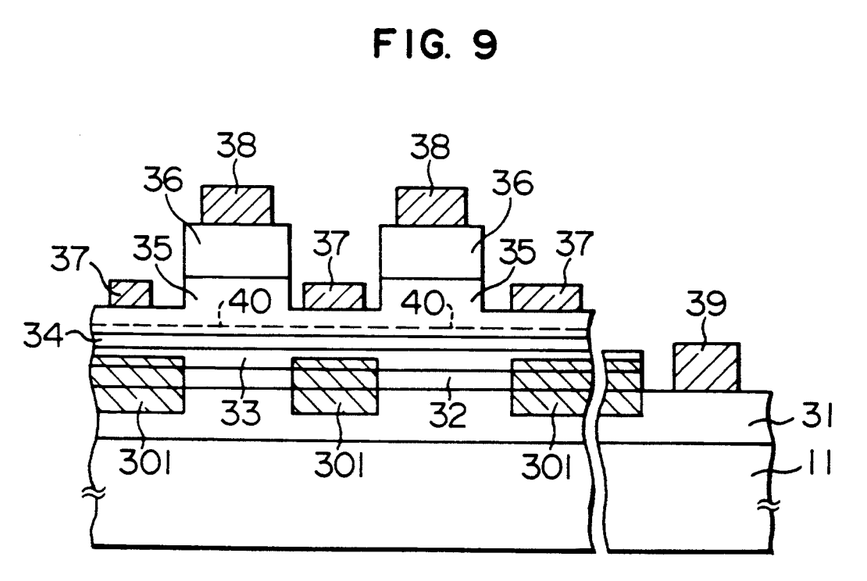
FIG. 9 is a cross-sectional view indicating a modification of the device structure indicated in FIG. 5A.
Figure 10:
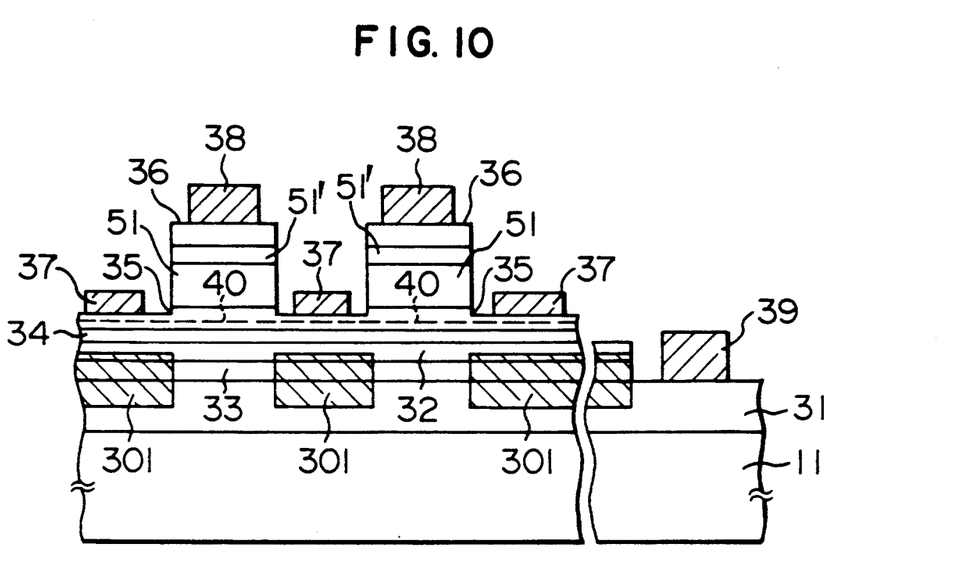
FIG. 10 is a cross-sectional view indicating a modification of the device structure indicated in FIG. 7.

FIGS. 9 and 10 show circuits having a speed still higher than the high speed logic circuits having the cross-sectional structures indicated in FIGS. 5A and 7. The device structure of the high speed logic circuit indicated in FIG. 9 corresponds to the device structure of the high speed logic circuit indicated in FIG. 5A, while the device structure of the high speed logic circuit indicated in FIG. 10 corresponds to the device structure of the high speed logic circuit indicated in FIG. 7. The device structures indicated in FIGS. 9 and 10 are different from the device structures indicated in FIGS. 5A and 7 in that each of them has an isolation region 301. The isolation region 301 is formed mainly by killing free carriers in a part of the p-type AlGaAs layer 32 and the p-type GaAs layer 31 by a method such as oxygen implantation. By disposing the isolation region 301 in this way it is possible to decrease parasitic leak current and parasitic capacitance between the emitter and the base and thus to achieve increase in the speed. This isolation region 301 corresponds to the isolation region 300 indicated in FIG. 1A.

Figure 11:
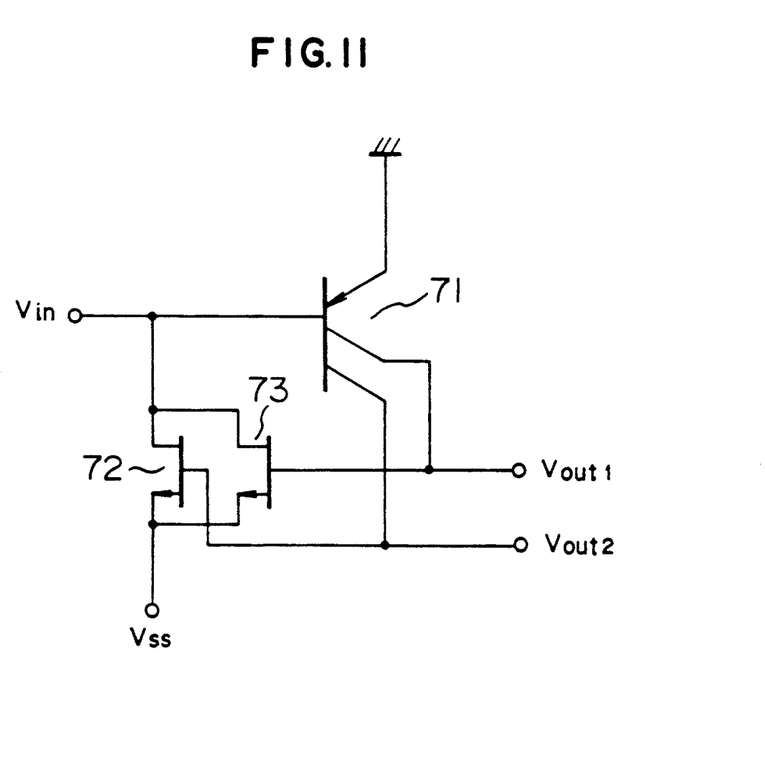
FIG. 11 is an equivalent circuit diagram of an embodiment for realizing a logic gate having two outputs.
Figure 12:
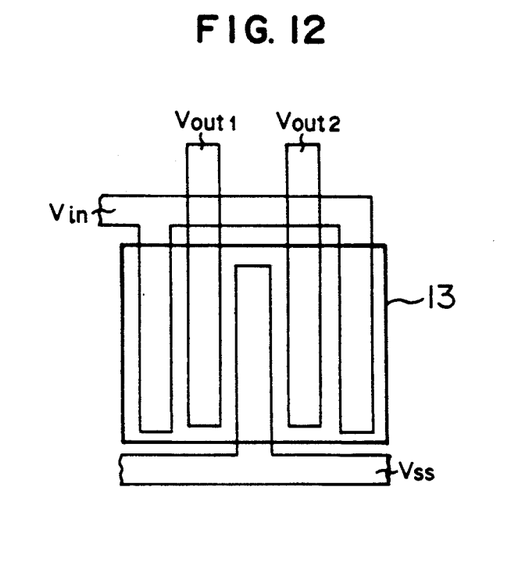
FIG. 12 is a schematical diagram indicating an electrode arrangement for the logic circuit having two outputs according to the present invention.

FIG. 11 shows still another embodiment of the present invention. This represents a logic gate having two outputs constructed by using the equivalent circuit indicated in FIG. 1C. This logic circuit is realized by forming the electrode Vout 1 and the electrode Vout 2 on the collector region, putting the electrode Vss on the base region therebetween and by forming the electrode Vin on the base region on further outer side thereof, as a plan view thereof is indicated in FIG. 12. However, for the sake of simplicity, it is indicated in FIG. 12, omitting the isolation region and the emitter electrode in FIG. 1A. Concretely speaking, the part indicated by B in FIG. 5A corresponds to the cross-sectional structure in the present embodiment. That is, the high speed logic circuit indicated in FIG. 1A can be constructed by using the central electrode 37 for Vss, the two outermost electrodes 37 for Vin and the other electrodes 38 for Vout 1 and Vout 2, respectively, in FIG. 5A.

The operation of the present invention can be explained similarly to the operation of the equivalent circuit indicated in FIG. 1C. When the input Vin is at the low level (the output of the logic circuit in the preceding stage being in the high impedance state), the BJT is turned ON and both the two terminals Vout 1 and Vout 2 are at the high level. Consequently the FETs 72 and 73 are in the ON state, because the gates thereof are at the high level. On the other hand, when the input Vin is at the high level (the output of the logic circuit in the preceding stage being in the ON state), currents flowing through the FETs 72 and 73 increase. Thus the base potential of the BJT 71 is raised and it is turned OFF.

Consequently both the terminals Vout 1 and Vout 2 are at the low level and both the FETs 72 and 73 are in the OFF state, because the gates thereof are at the low level.

Figure 13:
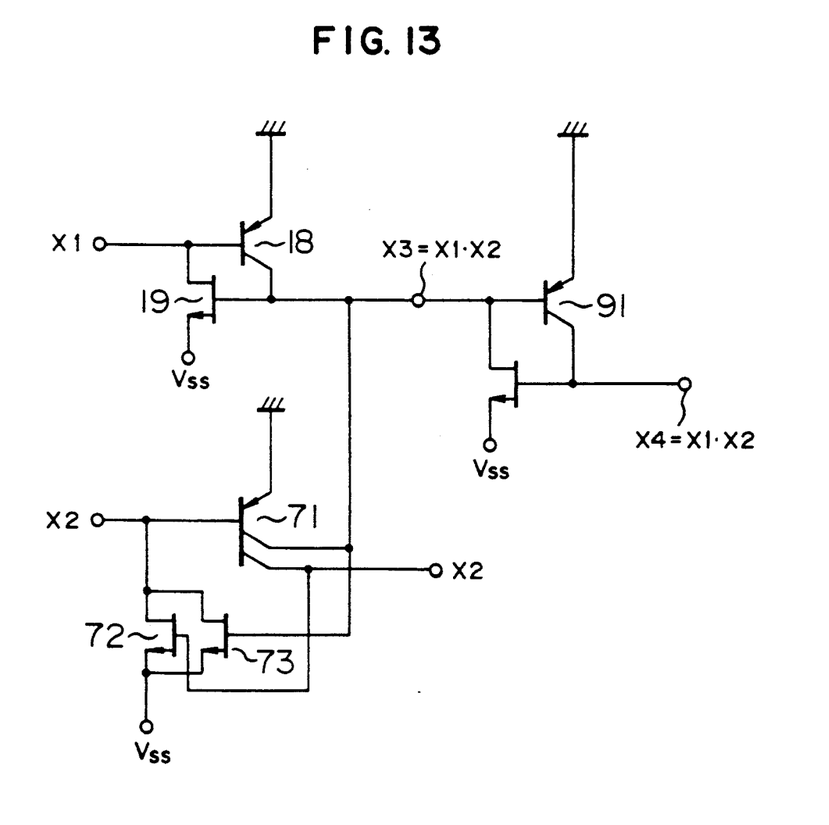
FIG. 13 is a circuit diagram indicating an example of the construction of the logic circuit, to which the present invention is applied.

FIG. 13 shows an example of a simple logic circuit constructed by using the logic gate circuit having one output indicated in FIG. 1A and the logic gate circuit having two outputs indicated in FIG. 11. Here input signals X1 and X2 are inputted into the base electrodes of the BJTs 18' and 71', respectively. The output of the BJT 18' and one of the outputs of the BJT 71' are connected with each other and inputted into the base of the BJT 91 in the following stage as a signal X3. It is when either one or both of the BJT 18 and the BJT 71 is/are in the ON state (input being at the low level, output being at the high level) that current flows into the base of the BJT 91. Consequently X3 is an OR logic of inverted signals of X1 and X2, i.e. NAND logic of X1 and X2. Since X3 is inverted further by the BJT 91, the output X4 of this logic circuit is an AND logic of X1 and X2.

By a similar way of thinking, it is possible to realize various sorts of logic circuits by constructing suitable circuits by combining several logic circuits according to the present invention.

As described above, high speed logic circuits according to the present invention can be applied easily to logic circuits, which have been conceived heretofore to be made of Si or usual GaAs and manufactured, and information processing devices using them.

Although, in the above embodiments, the logic circuit including an HBT using a two-dimensional electron gas layer was described, it is obvious that the logic circuit may be constructed by an HBT using a two-dimensional hole gas layer obtained by inverting the conductivity type of each of the layers (inverting p into n and n into p). Further, from the point of view of materials, although an AlGaAs/GaAs hetero-junction was used, it is clear that the present invention can be applied also to hetero-junctions made of Si/SiGe, AlGaAs/InGaAs, AlInAs/InGaAs, etc.

As explained above, by using the high speed logic circuit according to the present invention, it is possible to construct one gate circuit by using one transistor, which cannot be realized by using a circuit of IIL system utilizing a composite structure of prior art bipolar transistors, a circuit of usual FETs, e.g. circuit of CMOS or NMOS, by utilizing a hetero-junction bipolar transistor using two-dimensional carriers formed at a hetero-junction interface as a base layer as well as the property that the two-dimensional carriers form at the same time the active layer for a field effect transistor. Further, compared with the structure of the IIL system, it is possible to realize a high speed logic circuit, in which storage of minority carriers in the saturation region proper to the bipolar transistor is eliminated.

We claim:

1. A high speed logic circuit comprising:
a vertical hetero-junction bipolar transistor, in which two-dimensional carriers formed at a semiconductor hetero-junction interface are used as a base layer, the uppermost layer being a collector layer, the lowest layer being an emitter layer; and wherein
said bipolar transistor has two base electrodes making contact with the base layer, putting a collector electrode on said collector layer horizontally therebetween, and said base electrodes are used at the same time as a source electrode and a drain electrode, respectively, of a field effect transistor using said two-dimensional carriers as an active layer, one of the base electrodes of said bipolar transistor being an input terminal, the other being connected with a power supply, the emitter being grounded, the collector being an output terminal.

2. A high speed logic circuit according to claim 1, wherein said bipolar transistor is of pnp type, the power supply connected with the other base electrode is negative, and an absolute value thereof is greater than a voltage between the base and the emitter of said bipolar transistor.

3. A high speed logic circuit according to claim 2, wherein the junction between the base and the emitter of said bipolar transistor is constituted by a hetero-junction.

4. A high speed logic circuit comprising:
a vertical hetero-junction bipolar transistor, in which two-dimensional carriers formed at a semiconductor hetero-junction interface are used as a base layer, the uppermost layer being a collector layer, the lowest layer being an emitter layer; and wherein
said bipolar transistor has two base electrodes contacted with said base layer, putting a collector electrode therebetween; a field effect transistor using said two-dimensional carriers as an active layer is formed, one of the base electrodes being a drain electrode, the other being a source electrode, said collector electrode being a gate electrode; the emitter of said bipolar transistor is grounded; said one of the base electrodes serves as an input; an output is taken out from said collector; and said field effect transistor is used as an injector, said other base electrode used at the same time as the source electrode of said field effect transistor being connected with a power supply.

5. A high speed logic circuit according to claim 4, wherein the gate of said field effect transistor is controlled by an output taken out from the collector of said bipolar transistor.

6. A semiconductor device comprising:
a semi-insulating substrate;
a first semiconductor layer formed on said semi-insulating substrate and having a first conductivity type;
a second semiconductor layer formed on said first semiconductor layer and having a second conductivity type;
a third semiconductor layer formed on a part of said second semiconductor layer and having the first conductivity type;
a first electrode connected electrically with said first semiconductor layer;
a pair of second electrodes disposed so as to put said third semiconductor layer therebetween and connected electrically with said second semiconductor layer; and
a third electrode connected electrically with said third semiconductor layer; and wherein
said first electrode is connected with a first power supply, and one of said second electrodes is connected with a second power supply, a signal being inputted through the other of said second electrodes and outputted from said third electrode.

7. A semiconductor device according to claim 6, wherein a junction between said first semiconductor layer and said second semiconductor layer constitutes a hetero-junction having two-dimensional carriers formed on said second semiconductor layer side of said junction interface.

8. A semiconductor device according to claim 7, wherein said two-dimensional carriers constitute the base layer of a transistor driven by using the other of said second electrodes as the base electrode, said first electrode as the emitter electrode and said third electrode as the collector electrode.

9. A semiconductor device according to claim 8, wherein said two-dimensional carriers act further at the same time as a channel layer of a field effect transistor driven by using said third electrode as the gate electrode and said second electrodes as the source electrode and the drain electrode, respectively.

10. A semiconductor device according to claim 7, further comprising an isolating region isolating different semiconductor layers between said first semiconductor layer and said second semiconductor layer except for a lower part of said third semiconductor layer.

11. A semiconductor device according to claim 7, wherein a junction between said second semiconductor layer and said third semiconductor layer constitutes a hetero-junction.

12. A semiconductor device according to claim 6, wherein said first, said second and said third semiconductor layer are formed by epitaxial growth using molecular beam epitaxy.

13. A semiconductor device according to claim 6, wherein said first, said second and said third semiconductor layer are formed by epitaxial growth using metal organic chemical vapor deposition.

14. A high speed logic circuit comprising:

an input node, through which a logic signal is inputted;

an output node, through which a logic signal is outputted;

a bipolar transistor having a base connected with said input node, an emitter connected with a ground potential, and a collector connected with said output node; and a field effect transistor having a gate connected with a collector of said transistor, drain connected with a base of said transistor, and a source connected with a power supply.

15. A semiconductor device according to claim 14, wherein said bipolar transistor is a vertical bipolar transistor, in which the uppermost layer is a collector layer and the lowest layer is an emitter layer, and a junction between a semiconductor layer forming said emitter layer and a semiconductor layer formed between said emitter layer and said collector layer is constituted by a hetero-junction, two-dimensional carriers formed at the hetero-junction interface acting as a base layer.

16. A semiconductor device according to claim 15, wherein said base layer acts at the same time as a channel layer of said field effect transistor.

17. A semiconductor device according to claim 15, wherein a junction between said collector layer and said semiconductor layer formed between said emitter layer and said collector layer is constituted by a hetero-junction.

18. A semiconductor device according to claim 14, wherein said field effect transistor acts as an injector supplying carriers to the base of said transistor.

19. A semiconductor device according to claim 18, wherein the gate of said field effect transistor is controlled by an output taken out from the collector of said bipolar transistor.

* * * * *